United States Patent
La Scala et al.

(10) Patent No.: US 8,649,141 B2
(45) Date of Patent: Feb. 11, 2014

(54) BY-PASS DIODE STRUCTURE FOR STRINGS OF SERIES CONNECTED CELLS OF A PHOTOVOLTAIC PANEL

(75) Inventors: Amedeo La Scala, Caltanissetta (IT); Francesco Pulvirenti, Acireale (IT)

(73) Assignee: STMicroelectronics S.R.L., Agrate Brianza (MB) (IT)

(\*) Notice: Subject to any disclaimer, the term of this patent is extended or adjusted under 35 U.S.C. 154(b) by 1057 days.

(21) Appl. No.: 12/491,044

(22) Filed: Jun. 24, 2009

(65) Prior Publication Data

US 2010/0002349 A1    Jan. 7, 2010

(30) Foreign Application Priority Data

Jul. 1, 2008 (IT) .............................. VA2008A0041

(51) Int. Cl.
*H02H 3/38* (2006.01)

(52) U.S. Cl.
USPC ........................................................ 361/86

(58) Field of Classification Search
USPC ........................................................ 361/86
See application file for complete search history.

(56) References Cited

U.S. PATENT DOCUMENTS

| 2004/0046595 A1* | 3/2004 | Ikehashi et al. ................ 327/157 |
| 2005/0189982 A1* | 9/2005 | Cheung et al. ................ 327/536 |
| 2008/0198523 A1* | 8/2008 | Schmidt et al. ................ 361/88 |

FOREIGN PATENT DOCUMENTS

| DE | 102005036153 | 12/2006 | ............... H02N 6/00 |
| JP | 9102622 A | 4/1997 | ............... G01R 31/26 |
| JP | 2002010520 A | 1/2002 | ............... H01L 31/04 |
| WO | 2006/125664 | 11/2006 | ............... H02J 7/35 |

\* cited by examiner

*Primary Examiner* — Jared Fureman
*Assistant Examiner* — Nicholas Ieva
(74) *Attorney, Agent, or Firm* — Allen, Dyer, Doppelt, Milbrath & Gilchrist, P.A.

(57) ABSTRACT

A by-pass circuit includes a first power MOS with an intrinsic diode, a first conduction terminal coupled to a cathode, a second conduction terminal coupled to an anode, and a control terminal. A tank capacitor is coupled to the anode. A second MOS has a first and second conduction terminals, a control terminal, and a turn-on threshold smaller than that of the intrinsic diode, the first conduction terminal thereof coupled to the cathode and the control terminal coupled to the anode, so the first MOS turns on when the array of cells are sub-illuminated. An oscillator and charge pump are supplied through the second conduction terminal of the second MOS to charge the tank capacitor. A control circuit is coupled to the control terminal of the first power MOS to switch it based upon a voltage of the tank capacitor and sign of the voltage between the cathode and anode.

15 Claims, 1 Drawing Sheet

BY-PASS DIODE STRUCTURE FOR STRINGS OF SERIES CONNECTED CELLS OF A PHOTOVOLTAIC PANEL

FIELD OF THE INVENTION

This disclosure relates in general to photovoltaic panels and similar multicell devices for converting energy, and, more particularly, to a by-pass diode structure for strings of series connected cells in case of sub-illumination or failure of one or more cells of the string.

BACKGROUND OF THE INVENTION

Photovoltaic panels contain a large number of series connected photovoltaic cells. In optimal conditions, the cells of a panel may be equally irradiated and crossed by the current delivered to an external circuit and eventually to an electric load. However there may be cases in which some cells of a panel are partially or completely shadowed (by leaves or other opaque objects, clouds, projected shadows, etc.). Even if only temporarily, sub-illuminated cells limit the flow of current generated by other cells in series thereto, that may be fully illuminated, thus significantly reducing the current yielded by the panel.

In case of almost complete darkening, darkened cells behave as inversely biased diodes that are a load for the other illuminated cells. Moreover, the current generated by the functioning cells may cause an overvoltage on the darkened cells that may surpass the breakdown voltage of the darkened cell.

This phenomenon, known with the name "hot-spot", may overheat the darkened cells and in certain cases even impair them irreparably with a consequent decline of current yield. Substantially, sub-illuminated and/or darkened cells dissipate electric power generated by the other cells.

To prevent damaging cells irreparably, in the photovoltaic panel and more precisely inside the so-called junction box of the panel, diodes having a low voltage drop in conduction (usually Schottky diodes) define "by-pass" diodes electrically connected or coupled in anti-parallel to segments of strings of series connected cells. These provide local low-resistance shunt current paths, thus by-passing a respective segment that contains the darkened cells of the string.

This approach protects the cells and the panels from permanent impairment, and may prevent a whole string of series connected cells from being permanently damaged excessively limited in ability to produce useful current. In practice, the shunt current is transferred to the by-pass diode that tends to overheat when shunting the current generated by the numerous fully illuminated cells. To minimize power dissipation, common Schottky diodes are used, nevertheless efficiency is noticeably penalized. A measure of such an energy conduction loss may be given by conventional connected panels realized with 8" cells, wherein the generated current may reach up to about 15 A, with a consequent potential power dissipation of several tens of Watts.

To obviate this, the document DE-102005036153-A1 discloses the use of a power MOS transistor as a by-pass diode. During normal functioning of the cells of the panel, the transistor remains off. If a certain string of cells or some of these are darkened, the current generated by the irradiated cells inverts the voltage on the by-pass MOS transistor by flowing in the intrinsic diode of the integrated structure of the transistor.

The voltage drop on the intrinsic diode is used, through an inductive circuit, for loading a capacitor. After a time defined by the time constant of the circuit, the MOS is turned on through a dedicated driving circuit, thus reducing the voltage drop down to few tens of mV, and thus reducing the dissipated power down to few hundreds of mW. When a second time constant elapses, the transistor is turned off, thus recharging the capacitor during the successive phase and so on, according to a cyclical functioning mode.

SUMMARY OF THE INVENTION

An objective of this disclosure is to provide a by-pass device that uses a power MOS transistor but may not use an inductor to thus be fully integratable.

This is attained by using an oscillator and a charge pump circuit supplied through a protection transistor and a control circuit of a driving stage of the gate of the by-pass MOS transistor, which depends on the sign of the voltage on the nodes of the group of cells in series and depends on the by-pass MOS transistor and on the charge voltage of a tank capacitor that supplies the control circuit and the driving stage.

DETAILED DESCRIPTION OF THE PREFERRED EMBODIMENTS

Figure 1:
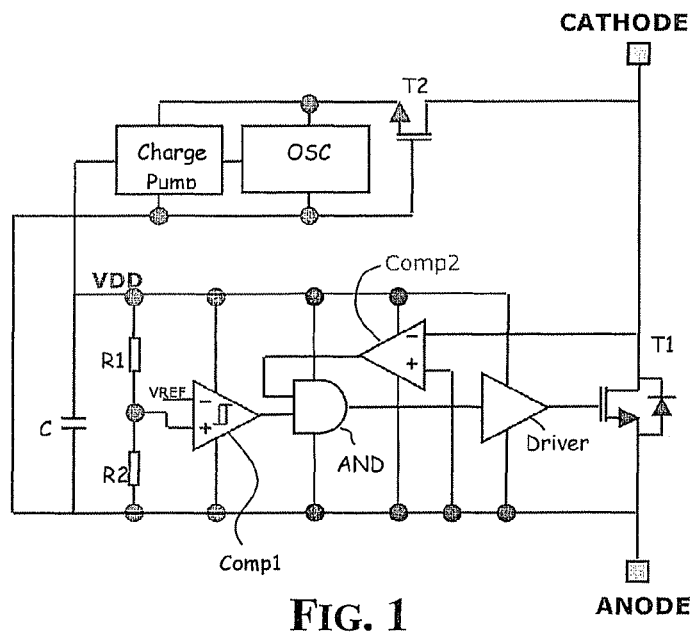
FIG. 1 is a circuit according to an exemplary embodiment of the present invention.

Referring to FIG. 1, an embodiment of a device is now described.

During normal functioning of a photovoltaic panel, the device is off and the voltage on the by-pass power MOS transistor T1 (between Drain and Source) that is between the cathode node (Cathode) and the anode node (Anode) of a string of cells in series, is positive.

In this normal functioning condition of the cells of the group, the MOS transistor T2 protects from high voltage the oscillator circuit normally realized with low voltage transistors. To this end, the transistor T2 may have a turn on threshold smaller than that of the intrinsic diode of the integrated structure of the MOS power transistor T1 (that is generally of about 300-400 mV).

When part of the panel and in particular the group of cells in series of the string connected between the respective cathode and anode nodes is shadowed, the current generated by other normally irradiated cells of the panel in flowing through the intrinsic diode of the transistor, inverts the sign of the voltage on the current nodes of the power MOS T1. Therefore, the voltage on the nodes of the power MOS T1 may become equal to or larger than −0.6V, a voltage sufficient to turn on the transistor T2, that in this condition works as a "pass gate", and sufficient also to allow the functioning of the oscillator circuit, realized with low-threshold MOS.

By exploiting this small voltage drop, the charge pump circuit in cascade to the oscillator, realized with low threshold MOS transistors, starts charging the tank capacitor C that quickly reaches the voltage (for example of about 5V) sufficient to turn on also the power MOS transistor T1 with a sufficient overdrive to minimize the series resistance.

The comparator Comp-1 determines with its logic state inversion of the sign of the voltage on the power MOS T1. From this instant onwards, the threshold comparator Comp-2, by sensing when the turn on threshold is reached, commands the turn on of the MOS T1 through the AND logic circuit that controls the driving stage Driver of the gate of the power MOS transistor. This comparator Comp-2 may have a certain voltage hysteresis (for example of about 500 mV), to space apart the turn off threshold from the turn on threshold.

Figure 2:
FIG. 2 illustrates an exemplary timing of the turn on phases of the by-pass MOS transistor of FIG. 1.

As graphically illustrated in FIG. 2, the circuit can be properly designed such that the turn on time of the MOS T1 be may significantly larger than the turn off time (for example >90%) that is helpful to restore the charge on the tank capacitor C, by compensating the loss of charge by a leakage effect and the consumption of the supplied circuits.

When the voltage on the tank capacitor C drops below the turn off threshold (for example below 4.5V), determined by the resistive voltage divider and by the hysteresis of the threshold comparator Comp-2, the MOS transistor T1 is turned off and the circuit starts a new cycle, the capacitor C is recharged and when the turn on threshold is attained, the transistor T1 is turned on again.

The polarity comparator Comp-1 turns on the by-pass MOS transistor T1, when the polarity on the nodes of the latter returns positive (that is when the cells of the string eventually by-passed by the power MOS start again generating current), thus effectively reducing undue power dissipations.

Figure 3:
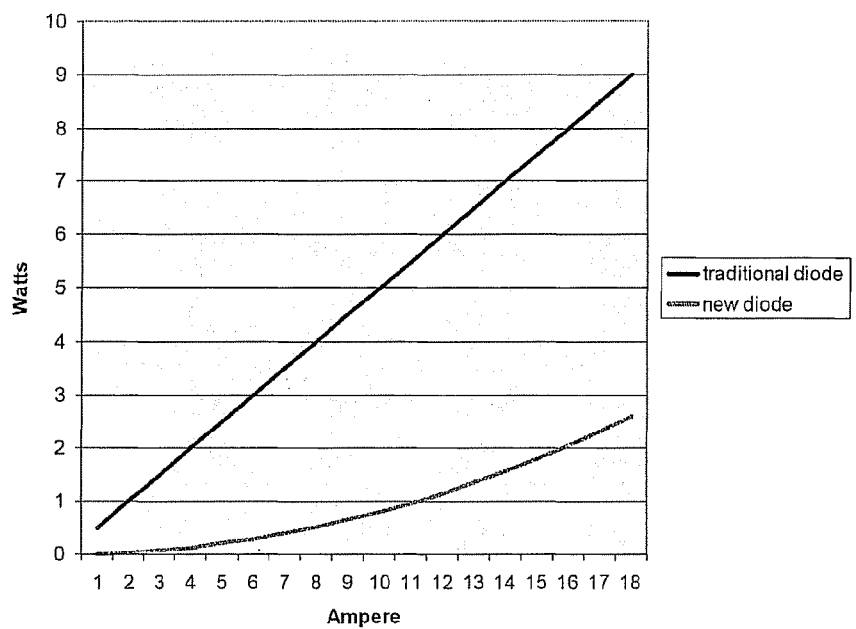
FIG. 3 is a graph that illustrates the different power consumption between an embodiment that employs a prior art by-pass Schottky diode, and an architecture as exemplified in FIG. 1.

The graph representation of FIG. 3 illustrates the difference in power consumption between two applications wherein a conventional Schottky diode (500 mV) and the architecture of this disclosure are used (Ron of the MOS T1=10 mΩ).

By summarizing, the circuit helps to minimize the power dissipated on the nodes of the intrinsic by-pass diode and this allows an increase of the overall conversion efficiency of the panel. Moreover, since the working current of the by-pass device is relevantly lower, the mean lifetime of the integrated power MOS and overall reliability of the system may be enhanced.

The architecture reduces the constraint of establishing a sufficiently long time constant based on an inductance, that from a fabrication point of view could severely decrease the yield because of the spread of integrated inductors, by tying together turn on and turn off of the power MOS transistor T1, events that are commanded by a threshold comparator Comp-2, with threshold voltages that may be easily and precisely established, for example, by means of a resistive voltage divider and that may be adjusted in function of the minimum turn on threshold of the power MOS transistor T1.

That which is claimed is:

1. A by-pass circuit for a photovoltaic panel comprising an array of cells having an anode and a cathode, the by-pass circuit comprising:
   a first power MOS transistor including an intrinsic diode and comprising a first conduction terminal to be coupled to the cathode, a second conduction terminal to be coupled to the anode, and a control terminal;
   a tank capacitor to be coupled to the anode;
   a second MOS transistor comprising a first conduction terminal, a second conduction terminal, a control terminal, and having a turn-on threshold smaller than that of said intrinsic diode of said first power MOS transistor, the first conduction terminal of said second MOS transistor to be coupled to the cathode and the control terminal to be coupled to the anode, so that said first MOS transistor turns on when the array of cells are sub-illuminated or failed;
   an oscillator and a charge pump coupled to the second conduction terminal of said second MOS transistor to charge said tank capacitor; and
   a control circuit coupled to the control terminal of said first power MOS transistor and configured to switch said first power MOS transistor on based upon a voltage of said tank capacitor and a sign of the voltage between the cathode and the anode, said control circuit comprising a comparator circuit configured to compare a voltage of said tank capacitor with a threshold voltage, said comparator circuit comprising
      a voltage divider coupled across said tank capacitor and having an intermediate node, and
      a comparator having a first input coupled to the intermediate node and a second input coupled to the threshold voltage.

2. A by-pass circuit according to claim 1, wherein said control circuit further comprises:
   a combinatory logic control circuit configured to control said first power MOS transistor based upon the comparator circuit and the sign of the voltage between the anode and the cathode.

3. A by-pass circuit according to claim 2, further comprising a second comparator to compare the cathode and the anode; and wherein said combinatory logic circuit comprises an AND gate having first and second inputs, said AND gate to receive an output signal of said comparator at the first input and to receive an output signal of said second comparator at the second input.

4. A by-pass circuit according to claim 3, wherein said second comparator and said combinatory logic control circuit are realized using MOS transistors protected by said second MOS transistor.

5. A by-pass circuit according to claim 1, wherein the by-pass circuit is fully integrated.

6. A by-pass circuit for a photovoltaic panel comprising an array of cells having an anode and a cathode, the by-pass circuit comprising:
   a first power MOS transistor including an intrinsic diode and comprising a first conduction terminal to be coupled to the cathode, a second conduction terminal to be coupled to the anode, and a control terminal;
   a tank capacitor to be coupled to the anode;
   a second MOS transistor comprising a first conduction terminal, a second conduction terminal, a control terminal, and having a turn-on threshold smaller than that of said intrinsic diode of said first power MOS transistor, the first conduction terminal of said second MOS transistor to be coupled to the cathode and the control terminal of said second MOS transistor to be coupled to the anode so that said second MOS transistor turns on when the array of cells are sub-illuminated or failed;
   an oscillator and a charge pump coupled to the second conduction terminal of said second MOS transistor to charge said tank capacitor; and
   a control circuit coupled to the control terminal of said first power MOS transistor and configured to switch said first power MOS transistor on based upon a voltage of said tank capacitor and a sign of the voltage between the cathode and the anode;

said control circuit comprising
a comparator circuit configured to compare a voltage of said tank capacitor with a threshold voltage, and
a combinatory logic control circuit configured to control said first power MOS transistor based upon the comparator circuit and the sign of the voltage between the anode and the cathode,
said comparator circuit comprising a resistive voltage divider coupled across said tank capacitor and coupled to the anode and having an intermediate node, and a hysteresis comparator having a first input to be coupled to the intermediate node and a second input to be coupled to the threshold voltage.

7. A by-pass circuit according to claim 6, further comprising a comparator to compare the cathode and the anode; and wherein said combinatory logic circuit comprises an AND gate having first and second inputs, said AND gate to receive an output signal of said hysteresis comparator at the first input and to receive an output signal of said comparator at the second input.

8. A by-pass circuit according to claim 7, wherein said comparator and said combinatory logic control circuit are realized using MOS transistors protected by said second MOS transistor.

9. A by-pass circuit for an electronic device having a cathode and an anode, the by-pass circuit comprising:
a first power MOS transistor including an intrinsic diode and comprising a first conduction terminal to be coupled to the cathode, a second conduction terminal to be coupled to the anode, and a control terminal;
a tank capacitor to be coupled to the anode;
a second MOS transistor comprising a first conduction terminal, a second conduction terminal, a control terminal, and having a turn-on threshold smaller than that of said intrinsic diode of said first power MOS transistor, the first conduction terminal being coupled to the cathode and the control terminal of said second MOS transistor to be coupled to the anode, so that said second MOS transistor turns on when the array of cells are sub-illuminated or failed;
an oscillator and a charge pump coupled to the second conduction terminal of said second MOS transistor to charge said tank capacitor; and
a control circuit coupled to the control terminal of said first power MOS transistor and configured to switch said first power MOS transistor on based upon a voltage of said tank capacitor and a sign of the voltage between the cathode and the anode, said control circuit comprising a comparator circuit configured to compare a voltage of said tank capacitor with a threshold voltage, said comparator circuit comprising
a voltage divider coupled across said tank capacitor and having an intermediate node, and
a hysteresis comparator having a first input coupled to the intermediate node and a second input coupled to the threshold voltage.

10. A by-pass circuit according to claim 9, wherein said control circuit further comprises:
a combinatory logic control circuit configured to control said first power MOS transistor based upon the comparator circuit and the sign of the voltage between the anode and the cathode.

11. A by-pass circuit according to claim 10, further comprising a comparator to compare the cathode and the anode; and wherein said combinatory logic circuit comprises an AND gate having first and second inputs, said AND gate to receive an output signal of said hysteresis comparator at the first input and to receive an output signal of the comparator at the second input.

12. A by-pass circuit according to claim 10, wherein said comparator and said combinatory logic control circuit are realized using MOS transistors protected by said second MOS transistor.

13. A method of making a by-pass circuit for a photovoltaic panel comprising an array of cells having an anode and a cathode, the method comprising:
coupling a first conduction terminal of a first power MOS transistor including an intrinsic diode to the cathode and coupling a second conduction terminal of the first power MOS transistor to the anode;
coupling a tank capacitor to the anode;
coupling a first conduction terminal of a second MOS transistor having a turn-on threshold smaller than that of the intrinsic diode of the first power MOS transistor to the cathode, and coupling a control terminal of the second MOS transistor to the anode, so that the second MOS transistor turns on when the array of cells are sub-illuminated or failed;
coupling an oscillator and a charge pump to the second conduction terminal of the second MOS transistor, and configuring the charge pump to charge the tank capacitor; and
coupling a control circuit to the control terminal of the first power MOS transistor, the control circuit configured to switch the first power MOS on based upon a voltage of the tank capacitor and a sign of the voltage between the cathode and the anode, the control circuit comprising a comparator circuit to compare a voltage of the tank capacitor with a threshold voltage, with the comparator circuit comprising a voltage divider coupled across the tank capacitor and having an intermediate node, and a hysteresis comparator having a first input coupled to the intermediate node and a second input coupled to the threshold voltage.

14. A method according to claim 13, wherein the control circuit further comprises:
a combinatory logic control circuit to control the first power MOS transistor based upon the comparator circuit and the sign of the voltage between the anode and the cathode.

15. A method according to claim 14, further comprising configuring a comparator to compare the cathode and the anode; and wherein the combinatory logic circuit comprises an AND gate having first and second inputs, the AND gate configured to receive an output signal of the hysteresis comparator at the first input and to receive an output signal of the comparator that compares the cathode and the anode at the second input.

* * * * *